United States Patent [19]

Ritter

[11] Patent Number: 4,530,138
[45] Date of Patent: Jul. 23, 1985

[54] METHOD OF MAKING A TRANSDUCER ASSEMBLY

[75] Inventor: Catharine A. Ritter, Glen Burnie, Md.

[73] Assignee: Westinghouse Electric Corp., Pittsburgh, Pa.

[21] Appl. No.: 429,594

[22] Filed: Sep. 30, 1982

[51] Int. Cl.³ .............................................. H01L 41/22
[52] U.S. Cl. ..................... 29/25.35; 29/855; 156/285; 156/286; 156/290; 156/312; 310/325; 310/365
[58] Field of Search ............ 29/25.35, 25.42, 854–856; 310/325, 365, 334; 156/285, 286, 290, 312, 295

[56] References Cited

U.S. PATENT DOCUMENTS

| | | | |
|---|---|---|---|
| 2,423,922 | 7/1947 | Arndt, Jr. ..................... | 310/365 X |
| 2,877,363 | 3/1959 | Tibbetts .............................. | 310/365 |
| 3,183,378 | 5/1965 | McCracken et al. ............... | 310/325 |
| 3,187,207 | 6/1965 | Tomes ................................. | 310/325 |
| 3,299,301 | 1/1967 | Heilmann et al. ............. | 310/363 X |
| 3,681,171 | 8/1972 | Hojo et al. ........................ | 156/382 |
| 3,737,988 | 6/1973 | Bednarski ............................. | 29/596 |
| 3,798,746 | 3/1974 | Alphonse et al. ................ | 29/594 X |
| 3,819,348 | 6/1974 | Murray ............................ | 29/603 X |
| 3,918,151 | 11/1975 | Bol et al. ................................ | 29/603 |
| 3,960,635 | 6/1976 | La Roy et al. ...................... | 156/286 |
| 4,283,242 | 8/1981 | Regler et al. ........................ | 156/154 |
| 4,290,838 | 9/1981 | Reavill et al. ........................ | 156/286 |
| 4,300,272 | 11/1981 | Hafner et al. ...................... | 29/25.35 |
| 4,300,965 | 11/1981 | Schmidt et al. ..................... | 156/154 |

Primary Examiner—Carl E. Hall
Attorney, Agent, or Firm—Dean Schron

[57] ABSTRACT

A method of making a transducer which has a head mass, a tail mass and a plurality of piezoelectric rings arranged in a stack with alternate electrodes, which are to be glued to the piezoelectric rings. The electrodes are of the type which have a surface on either side defining passageways when abutting an adjacent component. The components are assembled without the use of adhesive and then placed into a vacuum chamber where the pressure is reduced. The pressure is then brought back to normal atmospheric pressure in the presence of an adhesive surrounding the stack, with the adhesive being drawn into the passageways and toward the interior of the stack as a result of the pressure differential created. The adhesive joins the components together and also coats the outside of the stack so that after curing it functions as an anti-arcing coating.

10 Claims, 7 Drawing Figures

METHOD OF MAKING A TRANSDUCER ASSEMBLY

BACKGROUND OF THE INVENTION

1. Field of the Invention

The invention in general relates to electro-acoustic transducers and more particularly to a simplified method for assembling a transducer of the longitudinal resonator type.

2. Description of the Prior Art

Many transducer units include a plurality of components which must be glued together during the assembly operation. For example a Tonpilz or longitudinal resonator type of transducer includes a head mass for projection and/or receipt of acoustic energy, a tail mass operative as an inertial element and active transducer means interposed between and coupled to the head and tail masses.

The active transducer means is generally comprised of a stack of rings of a ceramic piezoelectric having interposed ring electrodes to which electrical connections are made.

The method of building the transducer assembly is a very time consuming and therefore costly operation. The electrodes and piezoelectric rings are adhesively joined requiring the hand application of the adhesive to each side of the piezoelectric ring after which the stack is placed into a clamping device while the adhesive cures. After curing the stack is removed, necessary wires are soldered to the electrodes and the structure cleaned such as by means of a solvent for removing grease.

The head and tail masses are prepared for adhesive by means of degreasing and sandblasting operation and the cleaned stack, as well as electrically insulating washers on either end of the stack, is interposed between, and coupled to, the head and tail masses and secured in place by means of a stress bolt connecting the head and tail masses. The operation requires the hand application of adhesive to both sides of the insulating washers (or to one side of the washer and the corresponding side of the head or tail mass to which it is abutting). After the second curing the assembly requires another recleaning and sandblasting and since operation might be at elevated voltages an anti-arcing compound is placed over the stack to prevent arc over from an electrode of one polarity to an electrode lead of an opposite polarity. A typical anti-arcing compound which is utilized includes a solid such as acrylic resin in combination with a solvent such as toluene and trichlorethane, representing an irritating and hazardous solution to an assembler.

The assembly of the present invention eliminates the above enumerated costly and objectionable procedures and further lends itself to automatic production techniques.

SUMMARY OF THE INVENTION

The transducer of the present invention includes a plurality of components which must be assembled into a final transducer unit by gluing certain components together. Rather than applying the glue to the appropriate pieces prior to assembly of the unit, the present invention calls for first assembling the components of the transducer unit after which the gluing step is performed.

A longitudinal resonator transducer is described which includes a stack of piezoelectric rings having interposed electrodes for the stack coupled between a head and tail mass. The surface of an electrode is such as to allow for fluid flow and when situated between adjacent components defines fluid passageways. After assembly the pressure is reduced in the fluid passageways such as by placement of the unit in a vacuum chamber. This operation not only reduces the pressure within the fluid passageways but also reduces the pressure within the interior cavity of the stack. The pressure is then increased by bringing the unit back to normal atmospheric pressure while at least the stack is immersed in a flowable adhesive. The pressure differential resulting between the stack interior (as well as the passageways) when the unit is brought from a vacuum condition to a normal atmospheric pressure condition forces the flowable adhesive into the passageways constituting bonding joints between components of the stack.

DESCRIPTION OF THE PREFERRED EMBODIMENT

Figure 1:
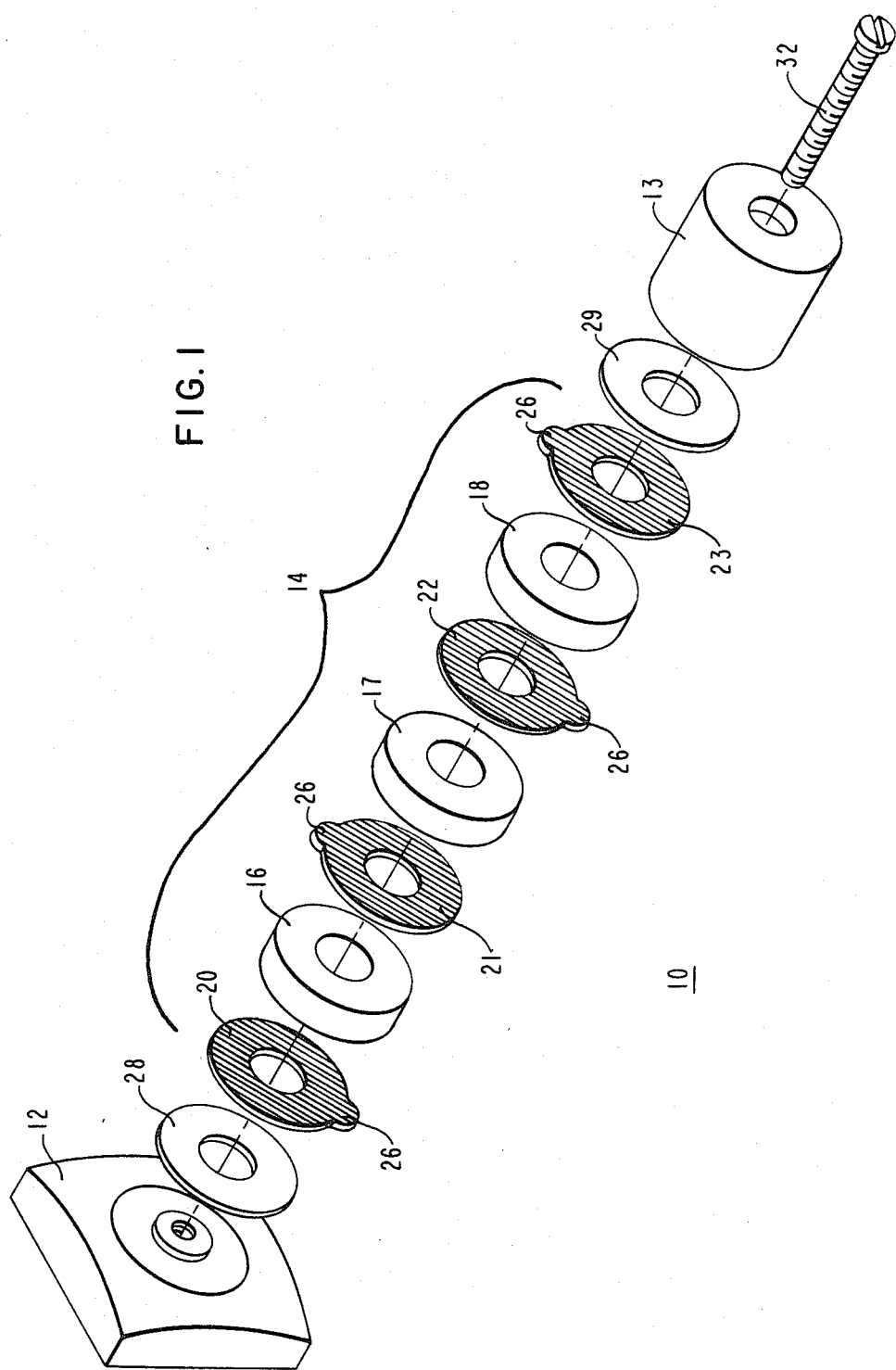
FIG. 1 is an exploded view and FIG. 2 is an assembled view, with a portion broken away, of a typical longitudinal resonator transducer.

Referring now to FIG. 1 there is illustrated a transducer unit shown by way of example to be a Tonpilz or longitudinal resonator type. The transducer includes a head mass 12 for projection and/or receipt of acoustic energy, a tail mass 13 operative has an inertial element, and active transducer means interposed between them and taking the form of a stack 14 of active transducer rings 16, 17 and 18 of the ceramic piezoelectric variety, by way of example.

For proper transducer action electrical connection must be made to opposite surfaces (in the longitudinal direction) of the rings and this is accomplished by means of electrodes 20 to 23 positioned between the rings (electrodes 21 and 22) as well as on either end of the stack (electrodes 20 and 23). Each of the electrodes includes a tab portion 26 to which electrical connections are made such as by the soldering of a wire lead with all of the even numbered electrodes being electrically connected together to constitute one polarity and with all of the odd numbered electrodes being electrically connected together to constitute an opposite polarity.

In order to isolate the electric potential from the head and tail masses 12 and 13 there is provided respective insulating washers 28 and 29 which may be made of a material such as alumina. The stack 14 is interposed between, and coupled to, the head and tail masses 12 and 13, with the interposed washers 28 and 29, and held in position by means of a stress bolt 32 threadedly engaged with the rear of head mass 12, as is standard practice.

Figure 2:
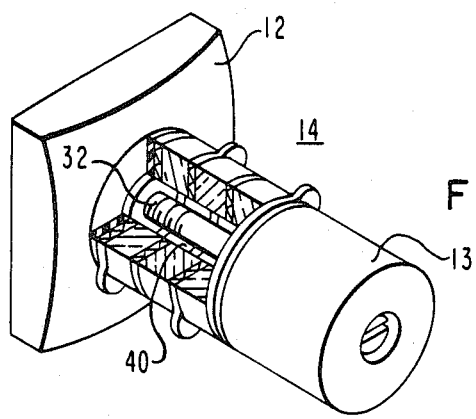
Figure 3:
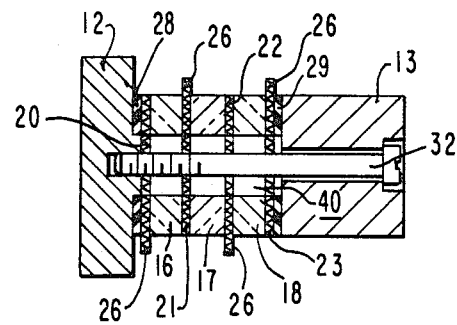
FIG. 3 is an axial cross-sectional view of the assembled transducer.

After the transducer is assembled, and as best illustrated in FIGS. 2 and 3, the components define a hollow interior cavity 40 inside the stack 14. As will be explained, the electrodes utilized in the transducer construction have serrated surfaces, or the like, so as to define a plurality of passageways between the outside of the stack and the interior cavity 40.

Figure 4:
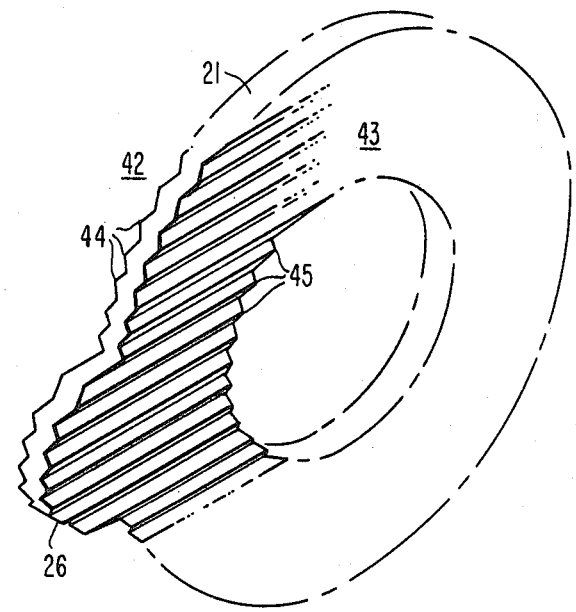
FIG. 4 is a more detailed view of one of the electrodes utilized in the transducer unit.

A typical electrode 20 is illustrated in FIG. 4. The electrode may be stamped out of a thin sheet of annealed nickel and thereafter placed in a die and then corrugated such that the front and rear surfaces 42 and 43 are serrated to define a plurality of peaks 44 and valleys 45. With the electrode placed between two adjacent components such that peaks 44 on both surfaces of the electrode make intimate contact with the respective components, then the valleys on either surface of the electrode define small passageways between adjacent components. This is illustrated in FIG. 5 to which reference is now made.

Figure 5:
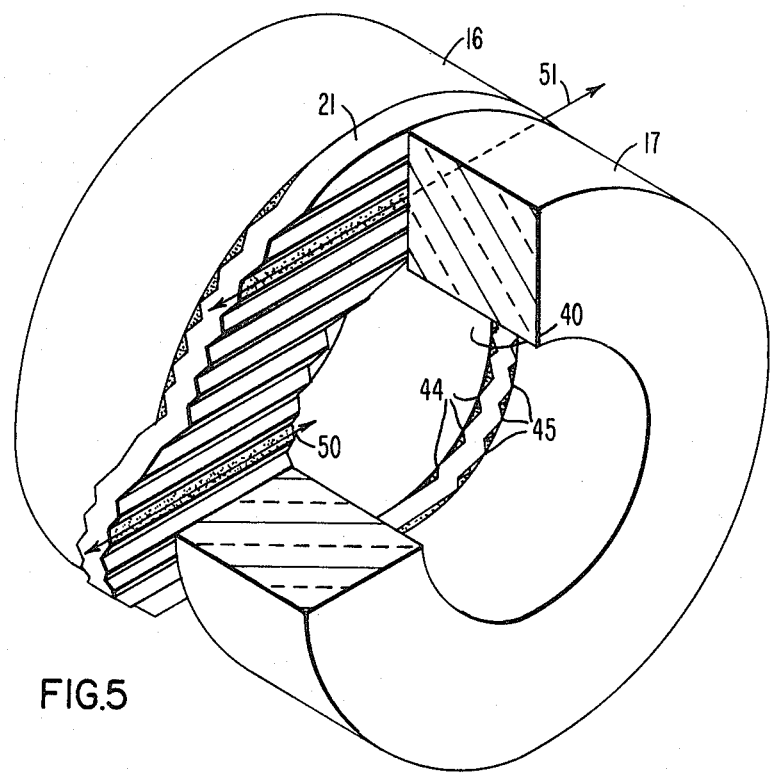
FIG. 5 is a view, with portions broken away, illustrating the passageways formed by the electrode of FIG. 4.

In FIG. 5 electrode 21 is sandwiched between piezoelectric ring 16 and piezoelectric ring 17, shown broken. The peaks 44 form an electrical contact with the rear surface of ring 16 and the front surface of ring 17 such that valleys 45 define a plurality of passageways some of which, as indicated by arrows 50 communicate the exterior of the stack to the interior cavity 40. Remaining passageways, as indicated by arrows 51 are in direct contact with the rings 16 and 17 but do not enter the cavity 40.

In accordance with the present invention the components illustrated in FIG. 1 are first assembled without the application of any adhesive to the individual components, as is done in prior art constructions. Suitable electrical leads are soldered to tabs 26 of the electrodes and the assembly is then cleaned. If the stack assembly were placed into an adhesive, the adhesive would not normally flow into the small passageways formed between the components by virtue of the electrode construction. If, however, the passageways are devoid of air or at a reduced pressure relative to the ambient medium, and if the stack is immersed in an adhesive, in such situation the adhesive will tend to flow to fill up the void.

Accordingly, means are provided for reducing the pressure within the passageways and internal cavity 40 to less than normal atmosphereic pressure. Thereafter, the pressure is brought back to normal atmospheric pressure while the stack is immersed in a flowable adhesive which is forced by the resulting positive pressure differential into the various passageways and toward the stack interior cavity. Many different techniques exist for accomplishing this action and one of them is illustrated in FIG. 6, by way of example.

Figure 6:
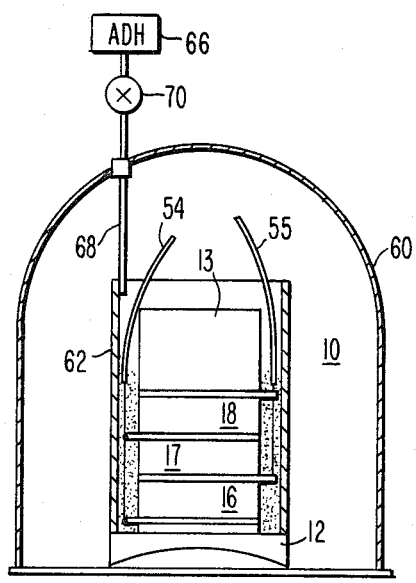
FIG. 6 illustrates one technique for applying the adhesive utilized in the transducer fabrication.

As illustrated in FIG. 6 the assembled transducer 10 including electrical leads 54 and 55 is positioned face down within a vacuum fixture or chamber 60 connected to vacuum pump apparatus not illustrated. A cylindrical sleeve 62 of a material such as teflon to which an adhesive will not stick is placed such as to surround the stack while contacting the rear surface of head mass 12. The vacuum pump apparatus is operated to draw a vacuum within the chamber 60 and accordingly within the passageways and interior cavity of the transducer.

A flowable adhesive from a source 66 is provided to the space between the stack of piezoelectric rings 16, 17 and 18 and the inside of sleeve 62. The adhesive delivered by conduit 68 when valve 70 is open is provided to a level which includes at least the stack and which may include a small portion of the tail mass 13. The vacuum is then released so that the chamber goes back to normal atmospheric pressure while the passageways and interior cavity are at the partial vacuum, the resulting pressure differential causing the liquid adhesive to flow into the passageways and toward the cavity.

Figure 7:
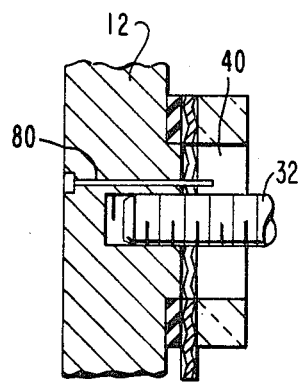
FIG. 7 illustrates a plugged pressure relieving aperture in the head mass of the transducer of FIG. 6.

The unit is then allowed to cure and after which the teflon sleeve 62 is removed. If a partial vacuum still exists in the interior cavity after the adhesive curing process, it may be relieved by drilling a tiny hole in the head or tail mass. Alternatively, and as illustrated in FIG. 7, the hole may be drilled before the adhesive process after which a plug 80 is inserted. Plug 80 will remain in place during the process described in FIG. 6 and may be removed after the curing is complete.

In yet another assembly method, a vacuum may be pulled on the interior cavity by means of the hole drilled in the head mass, while the stack is immersed in the adhesive which will then be pulled toward the cavity by virtue of the passageways provided by the electrode structure.

FIG. 1 illustrates three piezoelectric rings by way of example. It is to be noted that many Tonpilz transducer assemblies are designed with two, three or even four or more times as many piezoelectric rings as illustrated, thus significantly adding to the labor costs involved in their construction. With the present invention the need for the hand application of adhesive and the multi-step construction process is eliminated as is the requirement to apply an anti-arc coating which may have irritating and hazardous solvents, in view of the fact that with the present assembly the cured adhesive surrounding the stack additionally functions as an anti-arcing coating.

Tests on units made in accordance with the teachings of the present invention reveal transducer units with narrower resonant frequency bands and more uniform coupling coefficients from unit to unit.

In one construction a Tonpilz transducer was assembled having an aluminum head mass $\approx 0.2$ inches $\times 1.1$ inches $\times 1.1$ inches and a stainless steel tail mass 1.2 inches long $\times 0.75$ inches in diameter. Six piezoelectric rings were utilized and were of a lead-zirconite-titanate, piezoceramic material known as Navy III, each 0.19 inch in axial length by 0.75 inches in diameter with a wall thickness of 0.3 inches. The electrode rings were of annealed nickel with a peak to valley distance of 0.0015 inches and a thickness of 0.006 inches, being measured from the peak on one surface to the peak of an opposite surface. Alumina end washers were utilized separating the stack from the head and tail masses and an aluminum stress bolt was utilized to apply the proper compressive force to the stack.

The assembled components prior to the adhesive step were placed in a vacuum fixture wherein a vacuum was applied for a period of 45 minutes. The adhesive utilized was Epon 28-V40 epoxy available from the Shell Oil Company, and to reduce its normally high viscosity, the epoxy was heated for a period of 10 minutes at a temperature of 70° C. and then evacuated at that temperature for 8 minutes prior to application to the stack.

What I claim is:
1. A method of assembling a transducer having a plurality of components including a stack of piezoelectric rings, a head and tail mass and a plurality of electrodes having irregular surfaces, comprising the steps of:
    (A) assembling all of said components such that said electrodes are respectively positioned on both ends of said stack as well as interposed between piezoelectric rings, with said stack being interposed between, and coupled to, said head and tail masses, the irregular surfaces of said electrodes defining passageways between adjacent components;

(B) reducing the pressure within said passageways to less than normal atmospheric pressure;

(C) bringing said pressure back to normal atmospheric pressure while at least said stack is immersed in a flowable adhesive, the adhesive thereby flowing into said passageways;

(D) said adhesive also providing a coating surrounding said stack;

(E) curing said adhesive to bond the stack components together and provide an anti-arcing coating surrounding said stack.

2. A method according to claim 1 which includes the steps of:

(A) placing the assembly of step (A) into a vacuum chamber; and (B) drawing a vacuum to reduce said pressure within said passageways.

3. A method according to claim 1 which includes the step of:

(A) heating said adhesive prior to said immersion.

4. A method according to claim 1 which includes the step of:

(A) coupling said tail mass to said head mass by means of a stress bolt.

5. A method according to claim 1 wherein:

(A) at least a small portion of said tail mass is immersed in said adhesive.

6. A method of assembling a transducer having a plurality of components including a stack of piezoelectric rings, a head and tail mass, and a plurality of ring electrodes having serrated surfaces, comprising the steps of:

(A) assembling all of said components such that said electrodes are respectively positioned on both ends of said stack and are interposed between rings of said stack, with said stack being interposed between, and coupled to, said head and tail masses, so as to define a stack interior cavity;

(B) reducing the normal atmospheric pressure outside of said stack, whereby the pressure inside of said stack interior cavity also reduces by virtue of the passageways provided by said serrated surfaces of said electrodes;

(C) raising the pressure outside of said stack while at least the stack is immersed in a flowable adhesive, to thereby create a positive pressure differential to force said adhesive toward said stack interior cavity, along said passageways;

(D) said adhesive also providing a coating surrounding said stack;

(E) curing said adhesive to bond the stack components together and provide an anti-arcing coating surrounding said stack.

7. A method according to claim 6 wherein:

(A) the pressure outside of said stack is raised to no more than normal atmospheric pressure.

8. A method according to claim 6 which includes the step of:

relieving any residual pressure differential which may exist between the outside of said stack and said stack interior cavity, after said curing.

9. A method according to claim 8 which includes the steps of:

(A) predrilling one of said masses so as to form an aperture therethrough to said stack interior cavity;

(B) plugging said aperture with a plug prior to said immersion; and (C) removing said plug after said curing.

10. A method according to claim 9 wherein:

(A) said aperture is provided in said head mass.

* * * * *